COMPENSATING BASE FOR SIMULTANEOUSLY BONDING MULTIPLE LEADS

Filed June 15, 1967

INVENTOR
R. H. CUSHMAN
BY Walter L. Williamson
ATTORNEY

United States Patent Office 3,448,911

Patented June 10, 1969

3,448,911

COMPENSATING BASE FOR SIMULTANEOUSLY BONDING MULTIPLE LEADS

Robert Holbrook Cushman, Princeton Junction, N.J., assignor to Western Electric Company Incorporated, New York, N.Y., a corporation of New York Filed June 15, 1967, Ser. No. 646,249
Int. Cl. B23k *19/00*
U.S. Cl. 228—44 9 Claims

ABSTRACT OF THE DISCLOSURE

In simultaneously bonding a plurality of leads extending from a multileaded device to associated bonding sites on a generally planar surface of a workpiece such as contact areas on a thin-film circuit, difficulty is experienced (1) in compensating for lack of parallelism between the generally planar surface of the workpiece and a planar bonding surface of a bonding tool so as to apply substantially the same bonding pressure to each lead, and (2) in compensating for such lack of parallelism without permitting any substantial lateral displacement of the workpiece relative to the bonding tool which would either disturb the alignment of the leads relative to their associated bonding sites or damage the device and/or workpiece. A compensating base is disclosed having a platform for supporting a workpiece, and having a pivot mounted for lateral displacement for pivotally supporting the platform. A bonding tool is also disclosed having a recessed portion for receiving the multileaded device with each lead extending across a planar bonding surface of the bonding tool. As the bonding tool is displaced to bring the multileaded device into engagement with the workpiece, the workpiece is pivoted about the first point of contact to bring the workpiece into parallelism with the bonding tool so as to apply substantially the same bonding pressure to each lead to simultaneously bond the leads to their associated bonding sites. As the pivot which pivotally supports the platform is permitted lateral displacement, the workpiece pivots about the first point of contact with the bonding tool without any substantial lateral displacement of the workpiece relative to the bonding tool.

*Background of the invention*

A two-material approach to integrated circuits is being adopted in some segments of the communications industry, see October/November 1966 issue of the Bell Laboratories Record. Active components such as transistors and diodes as well as their interconnections are formed on a silicon wafer employing the silicon device manufacturing technology while precision resistors and capacitors are formed on glass or alumina substrates employing the tantalum thin-film technology. The two-material approach permits the mass manufacture of active components such as transistor sand diodes, and passive components such as capacitors and resistors having the high quality required for use in communication systems.

As will be appreciated, in order to realize the full potential of the two-material approach, it is necessary that the silicon integrated circuits such as beam lead devices and the tantalum circuits be reliably interconnected together. An additional, very practical requirement is that these interconnections be made economically. If, for example, each connection is made individually, lead bonding becomes a tedious, time-consuming operation and hence, often most uneconomical.

A solution to this problem is to shape a bonding tool to simultaneously contact a plurality of leads for simultaneous lead bonding. However, if there is any lack of parallelism between the surface to which the leads are bonded and the bonding surface of the bonding tool, excessive pressure may be applied to some leads while insufficient pressure is applied to other leads. This may result in some leads being sheared off or otherwise weakened while other leads are either not bonded or improperly bonded. In addition, movement of the circuits relative to the bonding tool to compensate for any lack of parallelism may cause the circuits to be laterally displaced across the bonding tool. This may displace the leads out of alignment relative to their associated contact areas so as to result in improper bonding, and/or drag or slide the workpiece across the bonding tool so as to damage a fragile circuit, such as beam lead devices.

It is, therefore, an object of this invention to provide an apparatus for compensating for any lack of parallelism between a workpiece and a bonding tool.

An additional object of this invention is to provide an apparatus for compensating for any lack of parallelism between a first workpiece and a bonding tool so as to apply substantially the same pressure to selected leads extending from a second workpiece to reliably bond the leads to associated bonding sites on the first workpiece.

Another object of this invention is to provide an apparatus for compensating for any lack of parallelism between a workpiece and a bonding tool without any substantial lateral displacement of the workpiece relative to the bonding tool.

Still another object of this invention is to provide a method for accomplishing the foregoing objects.

*Summary of the invention*

With these and other objects in view, this invention contemplates providing facilities for displacing a workpiece about that portion of the workpiece first contacted by a bonding tool to bring the workpiece into a parallel relationship with the bonding tool.

*Detailed description*

Figures 1, 2, 3, 4, 5, 6:
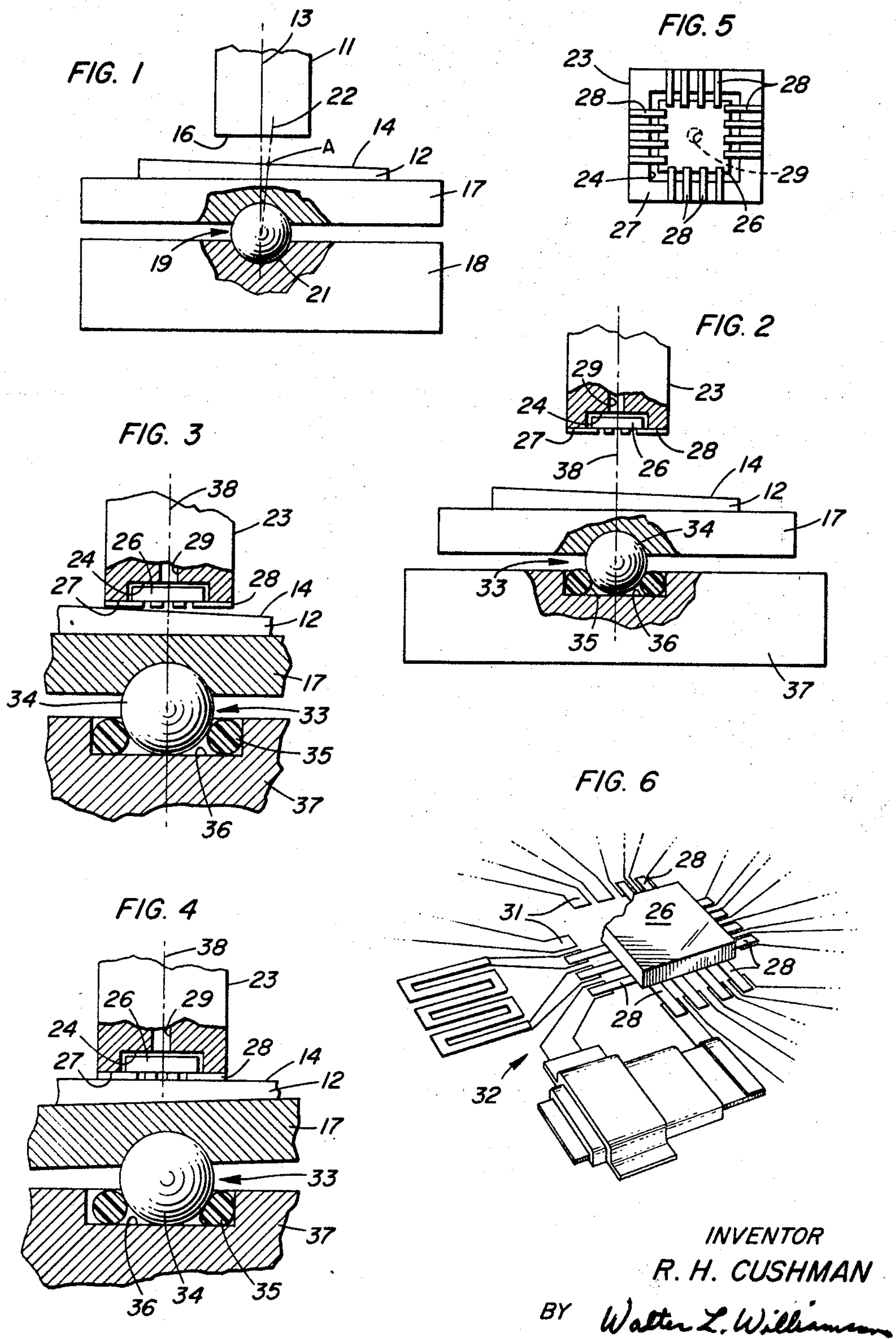
FIG. 1 illustrates an apparatus suitable for pivoting a workpiece into parallelism with a bonding tool.
FIG. 2 illustrates an apparatus suitable for pivoting a workpiece into parallelism with a bonding tool without any substantial lateral displacement of the workpiece relative to the bonding tool.
FIGS. 3 and 4 are enlarged partial views of FIG. 2 illustrating various operational sequences of the apparatus.
FIG. 5 is an enlarged end view of a bonding tool illustrated in FIGS. 2–4.
FIG. 6 is a perspective view of two workpieces, e.g., two circuits, which may be bonded according to the principles of this invention.

Referring now to FIGS. 1 through 6, a detailed description of the invention will be given. Although the principles of this invention are discussed infra with primary reference to simultaneously bonding a plurality of leads, the invention is not restricted to such simultaneous bonding and has general application whenever it is desired to equalize the pressure applied to a workpiece by a bonding tool over a relatively large area of the workpiece or to equalize the pressure applied at spaced intervals on a wowrkpiece. For example, the principles of this invention may be employed in bonding two ribbons together when it is desired to apply equal pressure across a relatively large area of the ribbons to produce a uniform bond. In addition, this invention has particular application whenever it is desired to correct for lack of parallelism between a workpiece and a bonding tool without laterally displacing the workpiece across the bonding tool. Also, although this invention is discussed infra with specific reference to thermocompression bonding, the invention is not restricted to any particular bonding technique and may be employed with a plurality of different bonding techniques such as thermocompression bonding, resistance welding, soldering, ultrasonic bonding, etc.

Referring now to FIG. 1, a bonding tool 11 is mounted in any conventional manner (not shown) for reciprocal displacement relative to a workpiece 12 along longitudinal axis 13 of the bonding tool. If generally planar surface 14 of workpiece 12 is not parallel to bonding surface 16 of bonding tool 11, the entire bonding surface 16 may not fully engage the surface 14. This may result in excessive pressure being applied to some areas of the surface 14 to cause damage to the workpieces and may result in adequate pressure being applied to other areas of the surface to produce either no bond at all or a weak, unreliable bond.

This lack of parallelism between surface 14 of workpiece 12 and surface 16 of bonding tool 11 may be corrected by supporting the workpiece 12 on a platform 17 which is pivotally mounted on a base 18, for example, by a ball and socket pivot 19. As the bonding tool 11 is lowered into engagement with workpiece 12, the workpiece pivots freely with platform 17 on pivot 19 about the center of ball 21 to bring surface 14 into a parallel relationship with surface 16 to compensate for any lack of parallelism. By permitting such relative movement between surface 14 and surface 16 to bring the surfaces into a parallel relationship relative to each other, the bonding pressure is substantially equalized to produce a reliable bond. However, pivotal movement of workpiece 12 about the center of ball 21 to bring the surface 14 into parallelism with surface 16 results in a lateral displacement of the surface 14 relative to surface 16. For example, as line 22 normal to surface 14 pivots in a counterclockwise direction about the center of ball 21 to bring surface 14 into parallelism with surface 16, point A on surface 14 is displaced to the left. This is illustrative of the type of lateral displacement which may be experienced by a workpiece relative to a bonding tool when the workpiece is pivoted into parallelism with the bonding tool.

Referring now primarily to FIGS. 2 through 6, a bonding tool 23 is illustrated having a recessed portion 24 for receiving a workpiece 26 such as beam lead device and having a planar bonding surface 27 for simultaneously contacting each lead 28—28. By drawing a vacuum on the bonding tool 23 through passageway 29 from any suitable vacuum source (not shown), the workpiece 26 may be held on the bonding tool preparatory to bonding the workpiece 26 to workpiece 12. The bonding tool 23 may be heated to a desired bonding temperature in any suitable manner such as, for example, with a resistance heating cartridge (not shown). It has been observed that the air flow across the workpiece 26 sufficiently cools the workpiece so as to avoid thermal damage to the workpiece. However, if the workpiece 26 is particularly heat sensitive, the bonding tool 26 may be quickly heated to the bonding temperature after the bonding tool is lowered into engagement with the workpiece 12.

As will be appreciated, in many situations, precise alignment of the workpieces 12 and 26 may be highly desirable. For example, it is not unusual for a beam lead device to have leads which are 2 to 4 mils wide spaced on 12.5 mil centers. Misalignment of the leads with their associated bonding sites such as contact areas 31—31 on a thin-film circuit 32 (FIG. 6) may result in some leads contacting more than one bonding site thereby short circuiting the device, or may result in some leads not properly contacting their associated bonding site to produce an open circuit condition or an unreliable bond.

In the arrangement illustrated in FIG. 2, such alignmen may be accomplished by displacing the workpiece 12 relative to the bonding tool 23 in any suitable manner to bring the workpieces and the bonding tool into alignment relative to each other. If the workpiece 26 is not held by bonding tool 23, the workpiece 12 may be aligned with the bonding tool 23 and then the workpiece 26 aligned with the workpiece 12, or the workpieces 12 and 26 may be aligned relative to each other and then relative to the bonding tool 23. However, if the workpiece 12 is permitted lateral displacement as the workpiece is pivoted into parallelism with bonding tool 23, the precise alignment of the workpieces 12 and 26 may be disturbed to such an extent that improper binding will occur.

In addition, such lateral displacement of a workpiece across the surface of a bonding tool may result in dragging or sliding of the workpiece across the bonding tool so as to damage the workpiece severely. For example, it is not unusual for a beam lead device to have gold leads extending therefrom which are only 2 to 4 mils wide and .3 to .7 mil thick. Such devices are extremely fragile and dragging or sliding of the devices across a bonding tool will frequently damage the devices.

Referring now to FIGS. 2 through 4, lateral displacement of the surface 14 across the bonding surface 27 may be substantially eliminated by providing platform 17 with a pivot 33 which is permitted lateral displacement as the surface 14 moves into a parallel relationship with bonding surface 27. Such lateral displacement of pivot 33 may be accomplished, for example, by pivoting the platform on a spherical member or ball 34 where the spherical member 34 is mounted in a resilient O-ring 35 retained in a blind bore 36 of base 37.

As illustrated in FIG. 3, as the bonding tool 23 is displaced toward workpiece 12 along axis 38, the bonding surface 27 strikes the highest portion of the surface 14 first. As illustrated in FIG. 4, as the bonding tool 23 continues to move toward the workpiece 12, the workpiece is pivoted in a counterclockwise direction about that first portion of the surface 14 which bonding surface 27 strikes and displaces spherical member 34 to the right against resilient O-ring 35 to compress the O-ring. As the resilient O-ring 35 permits lateral displacement of spherical member 34, the workpiece 12 pivots about that portion of surface 14 which first strikes the bonding surface 14 without any substantial lateral displacement of the surface 14 relative to the bonding surface 27. Substantially the same bonding pressure is applied to each lead to simultaneously bond each lead to its associated bonding site.

Many alternate arrangements may be employed for permitting a pivot lateral displacement and the utilization of a spherical member and a resilient O-ring is disclosed as being representative. For example, a pivot may be bonded to a resilient pad (not shown) to permit the pivot lateral displacement. Lateral displacement in this context refers to displacement which is generally perpendicular to the longitudinal axis of a bonding tool.

When the bonding tool 23 is displaced away from workpiece 12 along longitudinal axis 38, the resilient mounting of pivot 33 returns the pivot to its initial position (FIG. 2) in substantial alignment with the longitudinal axis 38 of the bonding tool 23 so as to facilitate the equalization of the pressure applied to the leads 28—28 by the bonding tool 23. For example, as initially aligned the axis 38 of bonding tool 23 passes through the center of the spherical member 34. The platform 17 is spaced from the base so that the platform can pivot to compensate for any lack of parallelism between the workpiece 12 and the bonding tool.

Although it is desirable for the resilient mounting of pivot 33 to exert a restoring force which is sufficient to return the pivot to its initial position, the restoring force should not be so large as to unduly resist the initial lateral displacement of the pivot. Otherwise, misalignment and/or dragging or sliding of the workpiece 12 across the bonding tool may occur. Neoprene rubber has been found to have the proper resiliency for most applications of the sort illustrated.

In bonding the leads of beam lead devices where the devices are on the order of from 30 to 80 mils wide and 30 to 80 mls. long, a spherical member having a diameter of 1/32 inch bonded to a 40 mil thick pad of neoprene rubber provides the desired resiliency to return the spherical member to its initial position without any substantial lateral displacement of the workpiece relative to the bonding tool. In simultaneously bonding leads over a larger area of from 2 to 4 inches wide and 2 to 4 inches long, a spherical member having a diameter of 1/8 inch mounted in a resilient O-ring having an inside diameter of slightly less than 1/8 inch and an outside diameter of approximately 3/8 inch provides sufficient resiliency to return the spherical member to its initial position without any substantial lateral displacement of the workpiece relative to the bonding tool.

In some instances, it may be desirable to provide against rotation of the platform 17 about the longitudinal axis of the bonding tool. Any suitable facility may be employed for prohibiting rotation of the platform which does not interfere with the desired pivotal movement of the platform or the desired lateral displacement of the platform pivot.

As will be appreciated by one skilled in the art, this invention is not limited to the specific arrangement disclosed and many variations and modifications may be made without departing from the spirit of this invention.

What is claimed is:

1. A bonding apparatus for simultaneously bonding leads to a workpiece having a generally planar surface, comprising:
- a bonding tool mounted for reciprocal displacement along its longitudinal axis to bring a planar bonding surface of the bonding tool into engagement with the planar surface of the workpiece, and
- means for pivoting the workpiece relative to the bonding tool about that portion of the planar surface of the workpiece which is first engaged by the planar bonding surface to bring the planar surface of the workpiece into parallelism with the planar bonding surface to simultaneously bond the leads to the workpiece.

2. An apparatus for compensating for lack of parallelism between a bonding tool and a workpiece without substantial lateral displacement of the workpiece relative to the bonding tool, comprising:
- means for pivoting a workpiece to bring the workpiece into parallel relationship to a bonding tool, and
- means for permitting lateral displacement of the means for pivoting to substantially eliminate lateral displacement of the workpiece relative to the bonding tool.

3. The apparatus of claim 2, including:
- means for returning the means for pivoting to its initial position when the bonding tool is displaced away from the workpiece.

4. An apparatus for compensating for lack of parallelism between a bonding tool and a workpiece without substantial lateral displacement of the workpiece relative to the bonding tool, comprising:
- means for pivoting the workpiece to bring the workpiece into a parallel relationship relative to a bonding tool, and
- means for resiliently mounting the pivot means to permit lateral displacement thereof to substantially eliminate lateral displacement of the workpiece relative to the bonding tool.

5. An apparatus for compensating for lack of parrallelism between a bonding tool and a workpiece without substantial lateral displacement of the workpiece relative to the bonding tool, comprising:
- a platform for supporting a workpiece,
- a pivot for pivotally supporting the platform, and
- means for resiliently mounting the pivot to permit lateral displacement thereof to substantially eliminate lateral displacement of the workpiece relative to a bonding tool when the platform pivots to bring the workpiece into parallelism with the bonding tool.

6. An apparatus for compensating for lack of parallelism between a bonding tool and a workpiece without substantial lateral displacement of the workpiece relative to the bonding tool, comprising:
- a platform for supporting a workpiece,
- a spherical member for pivotally supporting the platform, and
- a resilient O-ring for mounting the spherical member to permit lateral displacement thereof to substantially eliminate lateral displacement of the workpiece relative to the bonding tool when the workpiece pivots into a parallel relationship with the bonding tool.

7. A bonding apparatus for bonding a beam lead device having a plurality of leads extending therefrom to a generally planar surface of a workpiece, comprising:
- a platform for supporting a workpiece having a generally planar surface where the planar surface has a bonding site for each lead extending from the beam lead device,
- a bonding tool having a recessed portion for receiving the beam lead advice with each lead extending across a planar bonding surface of the bonding tool wherein each lead is brought into position relative to its bonding site when the bonding tool is displaced into engagement with the workpiece, and
- a pivot mounted for lateral displacement relative to the longitudinal axis of the bonding tool which pivotally supports the platform to permit the platform to be displaced to bring the planar surface of the workpiece into parallelism with the planar bonding surface without any substantial lateral displacement of the planar surface of the workpiece relative to the planar bonding surface.

8. The apparatus of claim 7, including means for returning the pivot to its initial position when the bonding tool is displaced away from the workpiece.

9. A bonding apparatus for simultaneously bonding leads extending from a beam lead-like device to a generally planar surface of a workpiece, comprising:
- means for supporting a workpiece having a generally planar surface where the planar surface has a bonding site for each lead extending from the beam lead-like device,
- a bonding tool having a recessed portion for receiving the beam lead-like device with each lead extending across a planar bonding surface of the bonding tool wherein each lead is brought into position relative to its bonding site when the bonding tool is displaced into engagement with the workpiece, and
- means for permitting relative displacement between the workpiece and the bonding tool to bring the generally planar surface of the workpiece into parallelism with the planar bonding surface thereby applying substantially the same bonding pressure to each lead to simultaneously bond each lead to its bonding site.

References Cited

UNITED STATES PATENTS

| | | | |
|---|---|---|---|
| 3,360,829 | 1/1968 | Germ | 18—42 |
| 2,163,876 | 6/1939 | Hill | 18—18 |

RICHARD H. EANES, Jr., *Primary Examiner.*

UNITED STATES PATENT OFFICE

CERTIFICATE OF CORRECTION

Patent No. 3,448,911 Dated: June 10, 1969

R. H. Cushman

It is certified that error appears in the above-identified patent and that said Letters Patent are hereby corrected as shown below:

In the specification, Column 1, line 59, "transistor sand" should have been --transistors and--. Column 2, line 66, "wowrkpiece" should have been --workpiece--. Column 3, line 17, "adequate" should have been --inadequate--; line 47, after "as" (second occurrence) insert --a--; lines 74-75, "alignmen" should have been --alignment--. Column 4, line 12, "binding" should have been --bonding--. Column 5, line 4, "mls" should have been --mils--.

In the claims, Column 6, line 29, "advice" should have been --device--.

SIGNED AND SEALED

MAR 17 1970

(SEAL)
Attest:

Edward M. Fletcher, Jr.
Attesting Officer

WILLIAM E. SCHUYLER, JR.
Commissioner of Patents